United States Patent [19]
Shirakawa et al.

[11] Patent Number: 5,758,276
[45] Date of Patent: May 26, 1998

[54] DOUBLE SUPER-HETERODYNE RECEIVER WITH LOW-PASS AND HIGH-PASS FILTERS CONTROLLED BY RESPECTIVE SWITCHING DEVICES

[75] Inventors: Hiroshi Shirakawa, Tokyo; Takashi Tomida, Saitama, both of Japan

[73] Assignee: Sony Corporation, Tokyo, Japan

[21] Appl. No.: 655,818

[22] Filed: May 31, 1996

[30] Foreign Application Priority Data

Jun. 29, 1995 [JP] Japan ................. 7-186237
Mar. 8, 1996 [JP] Japan ................. 8-080903
Mar. 26, 1996 [JP] Japan ................. 8-096069

[51] Int. Cl.$^6$ ........................................ H04B 1/26
[52] U.S. Cl. ................. 455/314; 455/209; 455/206; 455/339; 455/340; 333/178
[58] Field of Search ........................... 455/313, 314, 455/315, 260, 266, 339, 340, 289, 293, 207, 209, 197.1, 307; 537/172, 178

[56] References Cited

U.S. PATENT DOCUMENTS

| | | | |
|---|---|---|---|
| 4,939,789 | 7/1990 | Sakashita et al. | 455/260 |
| 5,060,297 | 10/1991 | Ma et al. | 455/302 |
| 5,222,255 | 6/1993 | Kuo et al. | 455/266 |
| 5,428,829 | 6/1995 | Osburn et al. | 455/197.1 |

*Primary Examiner*—Reinhard J. Eisenzopf
*Assistant Examiner*—Lee Nguyen
*Attorney, Agent, or Firm*—Jay H. Maioli

[57] ABSTRACT

A double super-heterodyne receiver has a high-frequency input circuit that includes a high-frequency amplifying device, a low-pass filter and a high-pass filter used for obtaining bandpass characteristics for the receiving band. A switching device for changing the cut-off frequency of, at least, the low-pass filter is further provided for the high-frequency input circuit. The switching device is controlled to be on or off in response to the receiving frequency, thereby changing the passband of the high-frequency input circuit. Image disturbance characteristics can thus be improved.

7 Claims, 7 Drawing Sheets

1

DOUBLE SUPER-HETERODYNE RECEIVER WITH LOW-PASS AND HIGH-PASS FILTERS CONTROLLED BY RESPECTIVE SWITCHING DEVICES

BACKGROUND OF THE INVENTION

1. Field of the Invention

The present invention relates to a double super-heterodyne receiver.

2. Description of the Related Art

In a short-wave receiver having a receiving band of, for example, from 3 to 26.1 MHz according to the double super-heterodyne method, a high-frequency input circuit may be constructed in the following manner. That is, a band-pass filter having the above-mentioned passband is disposed, whereby the input circuit may be formed of an aperiodic circuit type. A high-frequency input circuit of an aperiodic circuit type is simpler in construction than an input circuit of a tuned circuit type. Moreover, tracking adjustments between the aperiodic high-frequency input circuit and local oscillation circuits are unnecessary, thereby preventing sensitivity deviations caused by tracking errors.

However, the following problem is encountered when the high-frequency input circuit is formed of an aperiodic circuit type. Namely, when the receiving circuit is constructed according to the double super-heterodyne method (dual-conversion method), and the first intermediate frequency is set to be 10.7 MHz, image disturbance characteristics are degraded. More specifically, when the frequency conversion is performed by the upper heterodyne method, the image frequency caused when the minimum receiving frequency is at, for example, 3 MHz will be:

3 MHz+10.7 MHz+10 MHz=1.24.4 MHz

This image frequency is disadvantageously included in the receiving band, thereby deteriorating image disturbance characteristics.

One of the measures to overcome this drawback is to increase the first intermediate frequency. However, this also increases the first local oscillation frequency, which further decreases the carrier-to-noise (C/N) ratio of a voltage-controlled oscillator (VCO) of a phase-locked loop (PLL) that forms the first local oscillation circuit when the frequency synthesizer method is employed. Further, if the first intermediate frequency is made higher than the 10.7 MHz which is commonly used in typical radio receivers, a special type of a first intermediate frequency filter device is required, which makes the filter expensive.

SUMMARY OF THE INVENTION

Accordingly, it is an object of the present invention to provide a double super-heterodyne receiver which can solve the above-described problems.

In order to achieve the above object, according to the present invention, a low-pass filter and a high-pass filter are provided for a high-frequency input circuit of a double super-heterodyne receiver so as to obtain bandpass characteristics for the receiving band. Also, a switching device is disposed and controlled to be on or off in accordance with the receiving frequency, thereby changing the cut-off frequency of the low-pass filter. The passband of the high-frequency input circuit can thus be changed.

DESCRIPTION OF THE PREFERRED EMBODIMENTS

Figure 1:
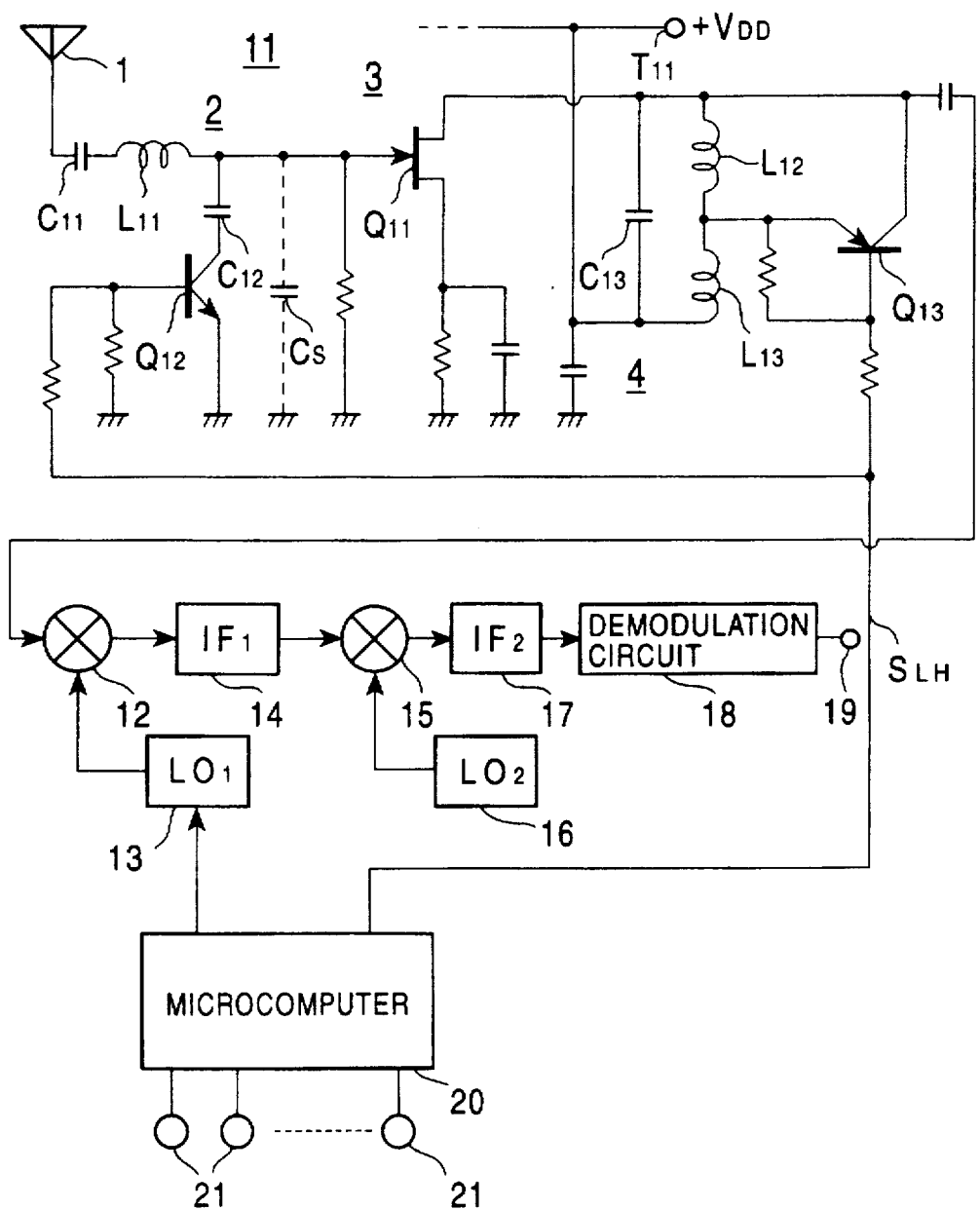
FIG. 1 is a circuit diagram of a first embodiment of the present invention.

A first embodiment will now be described with reference to FIG. 1. Referring to FIG. 1, a rod antenna 1, for example, is connected to the FET's (Q11) gate via a DC-cut capacitor C11 and a coil L11. Also, a capacitor C12 and the collector-emitter of the transistor Q12 are connected in series to each other between a ground and a node of the coil L11 and the FET's (Q11) gate.

With the above construction, when the transistor Q12 is off, a low-pass filter 12 is formed by the coil L11, and the floating capacitance Cs (including the input capacitance of the FET (Q11)) generated as viewed from the coil L11 toward the FET (Q11). The cut-off frequency of this low-pass filter 2 is set to be, for example, 26.1 MHz. On the other hand, when the transistor Q12 is on, the capacitor C12 also acts as part of the low-pass filter 2, whereby the cut-off frequency of the low-pass filter 2 becomes low. The cut-off frequency is set to be, for example, 9 MHz.

Further, the FET (Q11) forms a high-frequency amplifier 3. Accordingly, the FET (Q11) is source-grounded, and also, a series circuit of coils L12 and L13 and a parallel circuit of a capacitor C13 and the coils L12 and L13 are connected between the FET's (Q11) drain and a power-supply terminal T11. Connected in parallel to the coil L12 is the switching transistor's (Qi3) emitter-collector. When the transistor Q13 is on, the coil L13 and the capacitor C13 form a resonant circuit that exhibits bandpass characteristics. When the transistor Q13 is off, on the other hand, the coils L12 and L13 and the capacitor 13 form a resonant circuit that exhibits bandpass characteristics. The resonant circuit 4 serves as a high-pass filter 4 whose cut-off frequency in a high-frequency band is set in such a manner that it does not produce an adverse influence on the receiving band. When the transistor Q13 is on, the cut-off frequency of the high-pass filter 4 formed of the coil L13 and the capacitor C13 is set to be, for example, 9 MHz. In contrast, when the transistor Q13 is off, the cut-off frequency of the high-pass filter 4 is set to be, for example, 3 MHz.

Consequently, a bandpass amplifier-type high-frequency input circuit 11 is formed by the low-pass filter 2, the amplifier 3 and the high-pass filter 4. Among broadcast-wave signals received by the antenna 1, only signals in the receiving band are amplified by the FET (Q11) and are extracted from the high-pass filter 4. Then, the extracted broadcast-wave signals are supplied to a first mixer circuit 12, and at the same time, a first local oscillation circuit 13 extracts a first local oscillation signal whose frequency is higher by a predetermined value, for example, 10.7 MHz, than the targeted received frequency and sends this signal to the mixer circuit 12. The broadcast-wave signal extracted from the input circuit 11 is mixed with the first oscillation signal in the mixer circuit 12, and the resulting signal is thus converted to a first intermediate-frequency signal at, for example, 10.7 MHz.

The first intermediate-frequency signal is supplied to a second mixer circuit 15 via a first intermediate-frequency circuit 14 having an intermediate-frequency filter and an amplifier. At the same time, a second local oscillation circuit 16 extracts a second local oscillation signal whose frequency is higher than the first intermediate frequency by a predetermined value, for example, by 450 KHz, and supplies this signal to the second mixer circuit 15. As a result, the first intermediate-frequency signal is converted to a second intermediate-frequency signal at, for example, 450 kHz. The second intermediate-frequency signal is sent to an AM demodulation circuit 18 via a second intermediate-frequency circuit 17 having an intermediate-frequency filter and an amplifier and is demodulated to be an original sound signal which is then output at an output terminal 19.

In this receiver, the station is selected according to the frequency synthesizer method. Accordingly, the first local oscillation circuit 13 is comprised of a phase locked loop (PLL) and is also provided with a microcomputer 20. Operation keys 21 are manipulated to adjust the frequency-demultiplexing ratio of a variable frequency-demultiplier circuit of the PLL (first local oscillation circuit) 13 under the microcomputer 20 control so as to regulate the frequency of the first local oscillation signal. As a consequence, the receiving signal is changed in response to the manipulation of the keys 21.

Meanwhile, a control signal SLH is also produced by the microcomputer 20 and is supplied to the transistors' Q12 and Q13 bases. The control signal SLH varies according to the frequency of the first local oscillation signal, i.e., the received frequency; for example, when the received frequency ranges from 3 to 9 MHz, the control signal SLH becomes "1"; and when the frequency is higher than 9 MHz and lower than or equivalent to 26.1 MHz, the control signal SLH becomes "0". This can be expressed by: 3 MHz≦SLH= "1"≦9 MHz<SLH="0"≦26.1 MHz.

With this construction, when the control signal SLH is "1", the transistor Q12 is on, and the capacitor C12 is thus made effective, whereby the cut-off frequency of the low-pass filter 2 becomes 9 MHz. Also, since the control signal SLH is "1", the transistor Q13 is off, and the coil L12 can thus be rendered effective, whereby the cut-off frequency of the high-pass filter 4 becomes 3 MHz. Accordingly, the high-frequency input circuit 11 is operable as a bandpass amplifier, and as indicated by the solid line of FIG. 2A, the passband of the input circuit 11 ranges from 3 to 9 MHz. Only broadcast-wave signals having this band range are amplified and are supplied to the first mixer circuit 12. As a consequence, when the control signal SLH is "1", broadcast-wave signals having a frequency ranging from 3 to 9 MHz can be received.

On the other hand, when the control signal SLH is "0", the transistor Q12 is off, and the capacitor C12 is thus rendered ineffectual, whereby the cut-off frequency of the low-pass filter 2 becomes 26.1 MHz. Also, since the control signal SLH is "0", the transistor Q13 is on, and the coil L12 is thus made ineffective, whereby the cut-off frequency of the high-pass filter 4 becomes, for example, 9.01 MHz. The high-frequency input circuit 11 is thus operable as a band-pass amplifier, and as indicated by the solid line of FIG. 2B, the passband of the input circuit 11 is higher than 9 MHz and lower than or equivalent to 26.1 MHz. Only broadcast-wave signals having this band range can be amplified and sent to the first mixer circuit 12. As a consequence, when the control signal SLH is "0", broadcast-wave signals having a frequency higher than 9 MHz and lower than or equivalent to 26.1 MHz can be received.

Hence, on the whole, broadcast-wave signals ranging from 3 to 26.1 MHz can be received from the high-frequency input circuit 11. When a broadcast-wave signal having the lowest frequency at 3 MHz is received, the first local oscillation frequency becomes 13.7 MHz (=3 MHz+ 10.7 MHz) and the frequency of an image signal thus becomes 24.4 MHz (=13.7 MHz+10.7 MHz). However, the frequency of this image signal is not included in the pass-band (FIG. 2A) of the input circuit 11 which receives a broadcast-wave signal at 3 MHz. The same applies to broadcast-wave signals having frequencies other than 3 MHz. This can improve image disturbance characteristics even if the first intermediate frequency is as low as 10.7 MHz. Spurious disturbance characteristics can also be enhanced. Further, since the first intermediate frequency can be inhibited as low as, for example, 10.7 MHz, the first intermediate frequency circuit 14 can be inexpensively constructed, and also, the first local oscillation frequency can be decreased. As a result, when the frequency synthesizer method is employed, the carrier-to-noise (C/N) ratio of a voltage-controlled oscillator (VCO) of the PLL (the first local oscillation circuit) can be improved. Further, tracking adjustments are not required.

An explanation will now be given of a second embodiment with reference to FIG. 3. The same elements as those shown in FIG. 1 are designated by like reference numerals, and an explanation thereof will thus be omitted. Also, FIG. 3 shows the essential elements only, and more specifically, the elements designated by reference numerals 13 to 21 shown in FIG. 1 are similar to those of the second embodiment, and they are thus omitted from FIG. 3.

Figure 3:
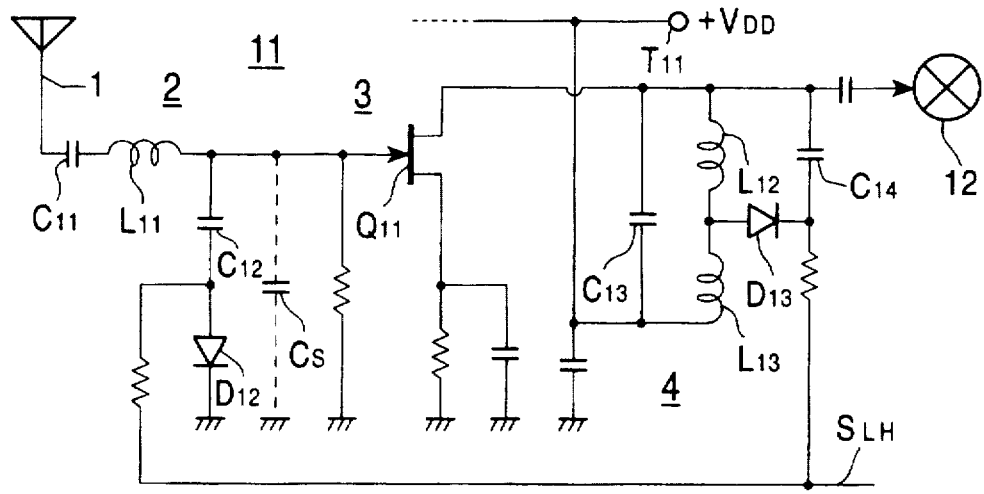
FIG. 3 is a circuit diagram of the essential portions of a second embodiment of the present invention.

In the high-frequency input circuit 11 shown in FIG. 3, in place of the transistors Q12 and Q13, diodes D12 and D13 are connected as switching devices. A capacitor C14 is used as a DC-cutting capacitor. Accordingly, in this circuit, as well as the circuit of the first embodiment, when the control signal SLH is "1", the diode D12 is on, while the diode D13 is off, whereby the passband ranges from 3 to 9 MHz. On the other hand, when the control signal SLH is "0", the diode D12 is off, while the diode D13 is on, whereby the passband ranges from 9 to 26.1 MHz.

Accordingly, in this high-frequency input circuit 11, as well as the counterpart of the first embodiment, improvements can be made in image disturbance characteristics even though the first intermediate frequency is as low as 10.7 MHz. Spurious disturbance characteristics can also be enhanced, and the first intermediate frequency circuit 14 can be produced at low cost. Further, the first local oscillation frequency can be decreased, thereby improving the C/N ratio of the VCO of the PLL (first local oscillation circuit) when the frequency synthesizer method is employed. Additionally, tracking adjustments are not required.

Figure 4:
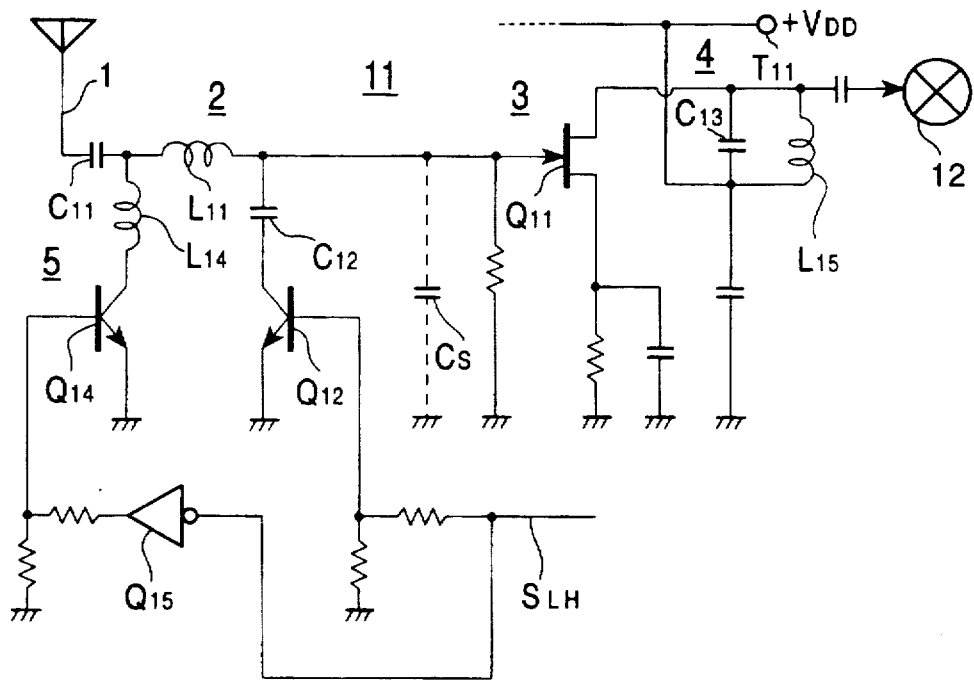
FIG. 4 is a circuit diagram of the essential portions of a third embodiment of the present invention.

FIG. 4 illustrates a third embodiment of the present invention and shows the essential elements only. The same elements as those shown in FIG. 1 are designated by like reference numerals, and no further description thereof is deemed to be necessary. Peripheral circuits of this embodiment are similar to, for example, those shown in FIG. 1.

The high-frequency input circuit 11 shown in FIG. 4 is constructed in such a manner that the cut-off frequency characteristics in a lower passband are obtained in the input terminal of the FET (Q11). More specifically, a coil L14 and the switching transistor's Q14 collector-emitter are connected in series to each other between a ground and the node of the capacitor C11 and the coil C11. Supplied to the transistor's Q11 base via an inverter Q15 is a control signal SLH. When the transistor Q14 is on, the capacitor C11 and the coil L14 form a high-pass filter 5. The cut-off frequency of the high-pass filter 5 is set to be, for example, 9 MHz. Also, a high-pass filter 4 is constructed by a resonant circuit formed of a capacitor C13 and a coil L15. The cut-off frequency of the high-pass filter 4 is set to be, for example, 3 MHz.

Figure 2A:
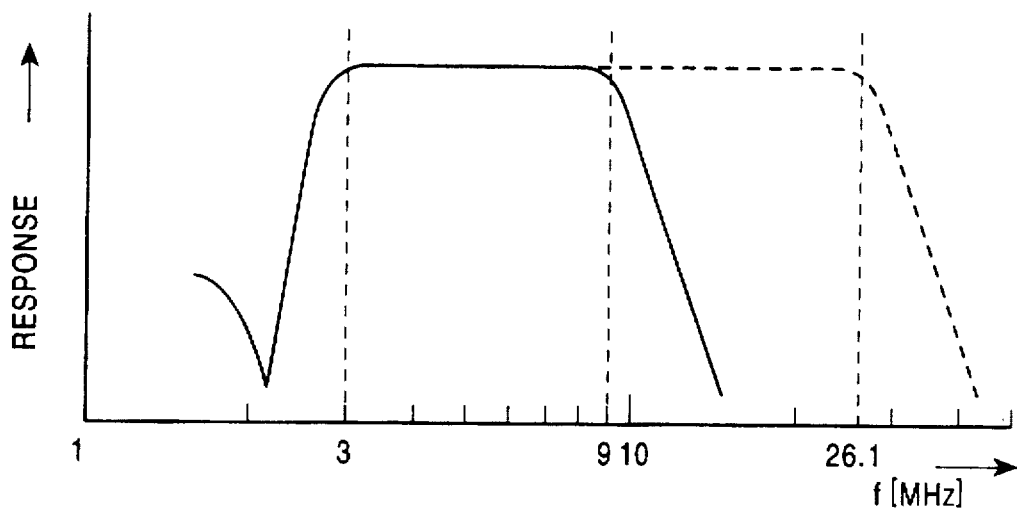
FIGS. 2A and 2B illustrate characteristics of the first embodiment of the present invention.

With this construction, when the control signal SLH is "1", the transistor Q12 is on, and the capacitor C12 is thus operable, whereby the cut-off frequency of the low-pass filter 2 is 9 MHz. Also, since the control signal SLH is "1", the transistor Q14 is off, and the high-pass filter 5 does not function. As described above, the cut-off frequency of the high-pass filter 4 is 3 MHz. The high-frequency input circuit 11 is thus operable as a bandpass amplifier, and the passband ranges from 3 to 9 MHz, as shown in FIG. 2A. Only broadcast-wave signals in this passband are amplified and supplied to the first mixer circuit 12. Accordingly, when the control signal SLH is "1", the broadcast-wave signals having a frequency at a range from 3 to 9 MHz can be received.

Figure 2B:
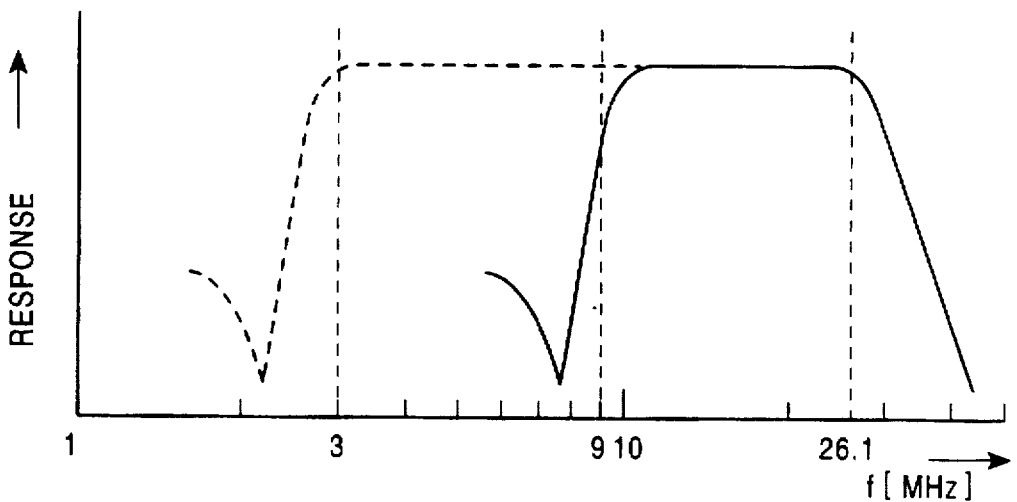

On the other hand, when the control signal SLH is "0", the transistor Q12 is off, and the capacitor C12 is inoperable, whereby the cut-off frequency of the low-pass filter 2 is 26.1 MHz. Additionally, since the control signal SLH is "0", the transistor Q14 is on, and the high-pass filter 5 is operable, whereby the cut-off frequency of the high-pass filter 5 is, for example, 9.01 MHz. The high-frequency input circuit 11 is thus operable as a bandpass amplifier, and the passband is higher than 9 MHz and lower than or equivalent to 26.1 MHz, as shown in FIG. 2B. Only broadcast-wave signals in this bandpass are amplified and supplied to the first mixer circuit 12. Accordingly, when the control signal SLH is "0", the broadcast-wave signals having a frequency at a range from 9 to 26.1 MHz can be received.

Figure 5:
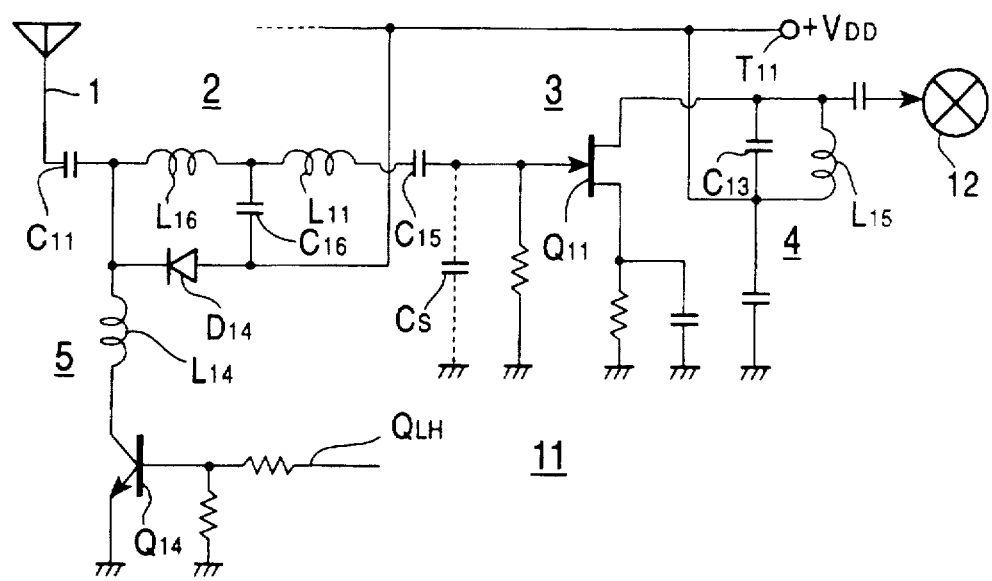
FIG. 5 is a circuit diagram of the essential portions of a fourth embodiment of the present invention.

FIG. 5 illustrates a fourth embodiment and shows the essential portions only. In the high-frequency input circuit 11 shown in FIG. 5, a switching diode D14 is used in place of the transistor Q12 for use in the input circuit 11 illustrated in FIG. 4. Capacitors C15 and C16 are used as DC-cutting capacitors.

When the receiving frequency ranges from 3 to 9 MHz, the control signal QLH becomes "0". On the other hand, when the receiving frequency is higher than 9 MHz and lower than or equivalent to 26.1 MHz, the control signal QLH becomes "1". This can be expressed by: 3 MHz≦QLH="0"≦9 MHz<QLH="1"≦26.1 MHz. If QLH is "0", the transistor Q14 is off, and the diode D14 is also off, whereby a low-pass filter 2 can be formed by coils L16 and L11 and the floating capacitance Cs. The levels of inductance of the coils L16 and L11 have been determined so that the cut-off frequency of the low-pass filter 2 can be, for example, 9 MHz. At this time, the cutoff frequency of the high-pass filter 4 is 3 MHz. Accordingly, when the control signal QLH is "0", the passband ranges from 3 to 9 MHz.

In contrast, when the control signal QLH is "1", the transistor Q14 is on, whereby the high-pass filter 5 can be formed by a capacitor C11 and a coil L14. The capacitance of the capacitor C11 and the inductance of the coil L14 have been determined so that the cut-off frequency of the high-pass filter 5 can be, for example, 9.01 MHz. Further, the transistor Q14 is on, and the diode D14 is accordingly on, whereby the coil L16 is shunted to be ineffective. The low-pass filter 2 is constructed by the coil L11 and the floating capacitance Cs. The cut-off frequency of the filter 2 is set to be, for example, 26.1 MHz. Accordingly, when the control signal QLH is "1", the passband is higher than 9 MHz and lower than or equivalent to 26.1 MHz.

Figure 6:
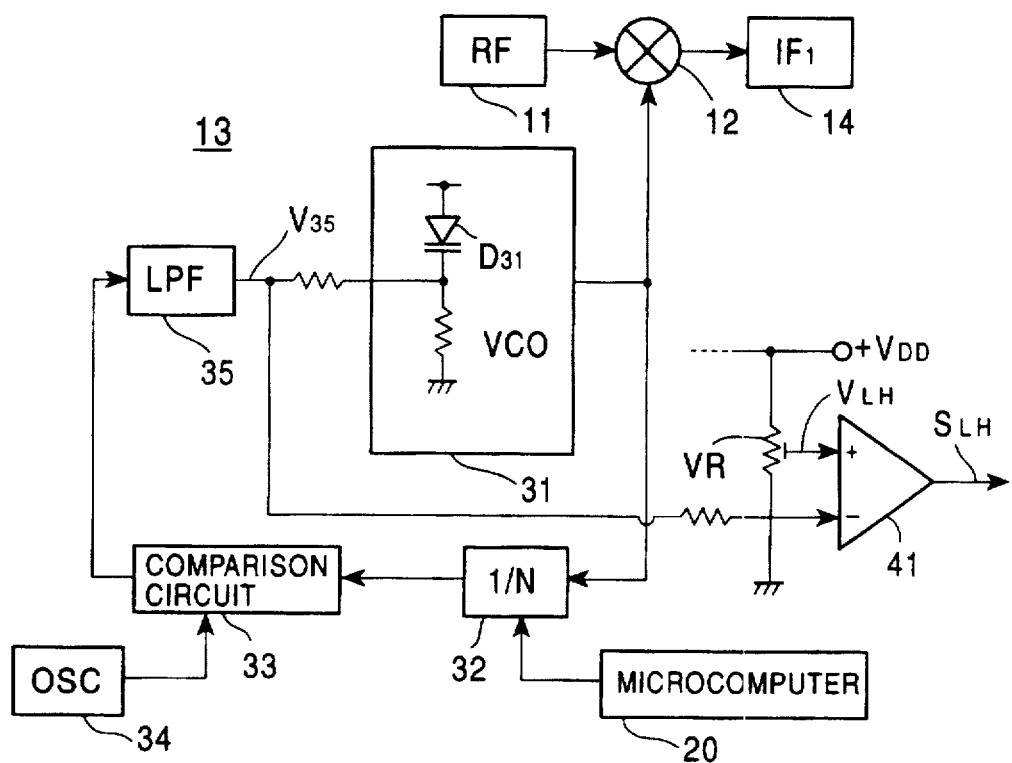
FIG. 6 is a circuit diagram partially illustrating a fifth embodiment of the present invention.

FIG. 6 illustrates a fifth embodiment and shows the essential elements only. The peripheral circuits are similar to, for example, those shown in FIG. 1, though they are not shown.

According to the first to fourth embodiments, the control signal SLH and the control signal QLH sometimes cannot be obtained from the microcomputer 20 for use in the input circuit 11 in the case where the capacity of the output port of the microcomputer 20 is full. For overcoming this drawback, the circuit shown in FIG. 6 is constructed in such a manner that the control signal SLH can be obtained through means other than the use of the output port of the microcomputer 20 when the first local oscillation circuit 13 is formed of a PLL. More specifically, a voltage-controlled oscillator (VCO) 31, a variable frequency-demultiplier circuit 32, a phase comparison circuit 33, an oscillation circuit 34 and a low-pass filter 35 are disposed as the PLL (first local oscillation circuit) 13. An oscillation signal of the VCO 31 is supplied to the first mixer circuit 12 as a first local oscillation signal, and is also fed to the variable frequency-demultiplier circuit 32 in which the frequency of the oscillation signal is demultiplexed to 1/N frequency. The demultiplexed signal is then sent to the phase comparison circuit 33. Meanwhile, an oscillation signal having a predetermined reference frequency is extracted from the oscillation circuit 34 and is supplied to the comparison circuit 33 as a reference signal.

The comparison result output from the comparison circuit 33 is supplied to the low-pass filter 35. Then, extracted from the low-pass filter 35 is a DC voltage V35 whose level is variable, based on the oscillation signal from the oscillation circuit 34, in response to errors in the phase and the frequency of a demultiplexing signal output from the frequency demultiplier circuit 32. This DC voltage V35 is fed to a variable-capacitance diode D31 that forms a resonant circuit of the VCO 31 so as to control the diode D31. The frequency demultiplexing ratio N of the frequency-demultiplier circuit 32 is set by the microcomputer 20.

In the steady state, the frequency of a demultiplexing signal from the frequency-demultiplier circuit 32 is equal to that of an oscillation signal from the oscillation circuit 34. Accordingly, the oscillation signal from the VCO 31, i.e., the first local oscillation signal, has a frequency corresponding to the frequency demultiplexing ratio N. The demultiplexing ratio N can thus be varied to change the receiving frequency. Since the DC voltage V35 is changed in response to the oscillation frequency of the VCO 31, it varies according to the receiving frequency. This DC voltage V35 is thus input for comparison into a voltage comparison circuit 41. At the same time, extracted from a potentiometer VR is a voltage VLH whose level is equal to the level of the DC voltage V35 obtained when a receiving signal has a frequency of, for example, 9 MHz. The voltage VLH is supplied to the comparison circuit 41 as a reference voltage. As a result, obtained from the comparison circuit 41 is the control signal SLH "1" when the receiving frequency is in a range from 3 to 9 MHz or SLH "0" when the receiving frequency is higher than 9 MHz and lower than or equivalent to 26.1 MHz.

Figure 7:
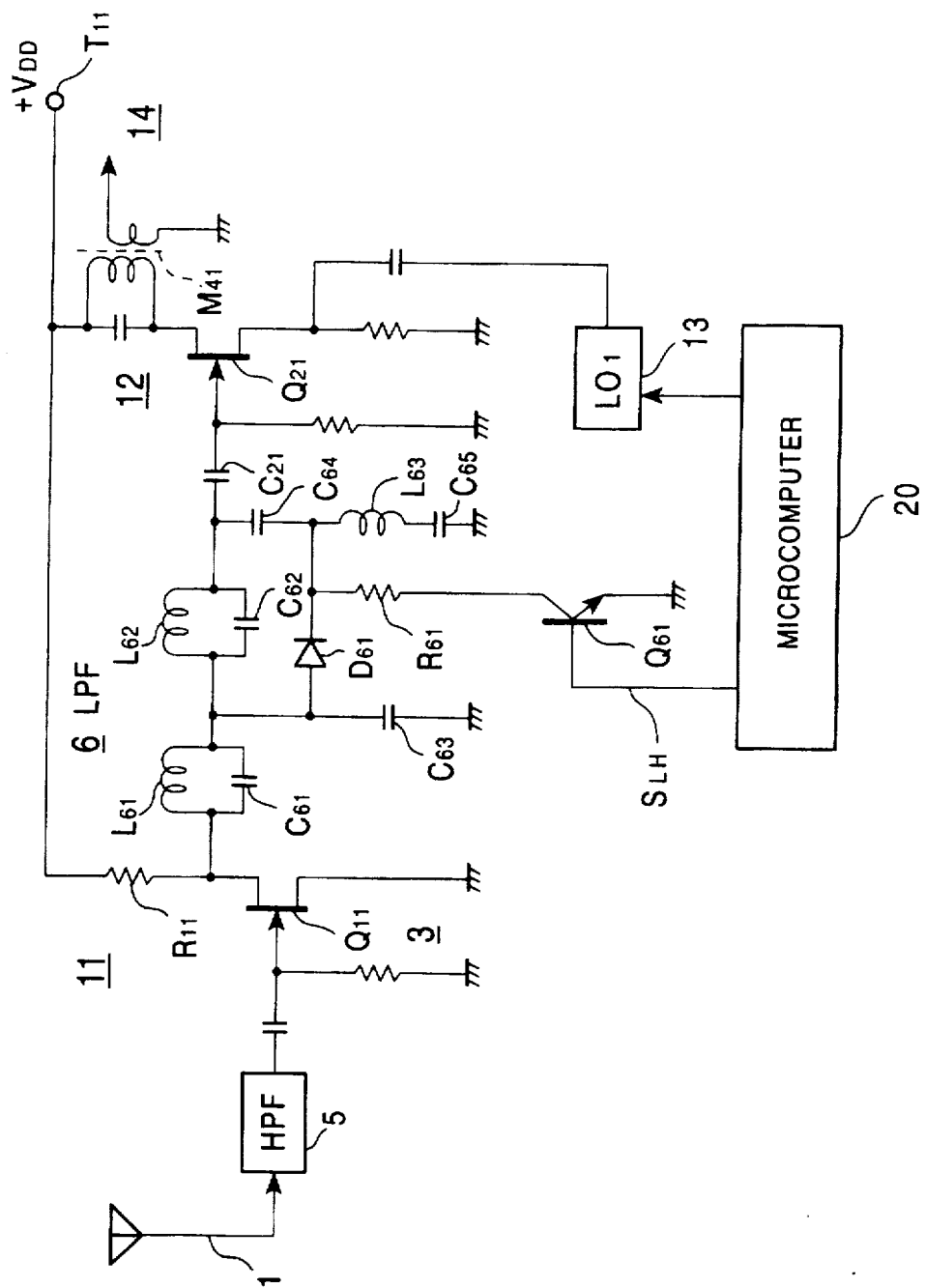
FIG. 7 is a circuit diagram of the essential portions of a sixth embodiment of the present invention.

FIG. 7 illustrates a sixth embodiment of the present invention and shows the essential elements only. The high-frequency input circuit 11 illustrated in FIG. 1 is constructed of a signal line in the order of the low-pass filter 2, the high-frequency amplifier 3 and the high-pass filter 4. Conversely, this order is totally reversed in the input circuit 11 shown in FIG. 7. Namely, the input circuit 11 is formed of a signal line in the order of the high-pass filter 5, the high-frequency amplifier 3 and the low-pass filter 6.

More specifically, in the receiver shown in FIG. 7, broadcast-wave signals received by the antenna 1 are supplied to the FET's (Q11) gate via the high-pass filter 5. The bandpass of the high-pass filter 5 is set to be not lower than the receiving band, i.e., 3 MHz or higher, and the frequency characteristics of the filter 5 are fixed. The FET (Q11) forms the high-frequency amplifier 3 whose source is grounded and whose drain is connected to a power supply terminal T11 via a resistor R11. Further, the low-pass filter 6 is connected to the FET's (Q11) drain. More specifically, the FET's (Q11) drain is connected to the FET's (Q21) gate through a signal line formed in the order of a parallel circuit of a coil L61 and a capacitor C61, a parallel circuit of a coil L62 and a capacitor C62 and a DC-cutting capacitor C21. A capacitor C63 is connected between a ground and a node of the two parallel circuits (the devices L61, C61, L62 and C62). Further, a capacitor C64, a coil L63 and a capacitor C65 are connected in series to each other between a ground and the node of the capacitor C21 and the parallel circuit formed of the coil L62 and the between the capacitor C62. In addition, a node between the capacitor C63 and the parallel circuits of the devices L61 to C62 is linked to the node of the capacitor C64 and the coil L63 via a diode D61. Further, a buffer resistor R61 and the collector-emitter of the switching transistor Q61 are connected in series to each other between a ground and the node of the above-mentioned two nodes.

An example of specifications of the above devices are given below:

| L61 = 3.3 μH | L62 = 4.7 μH | L63 = 1 μH |
| C61 = 3 pF | C62 = 2 pF | C63 = 13 pF |
| C64 = 6 pF | C65 = 24 pF | |

The FET (Q21) forms the first mixer circuit 12 and is source-grounded. The FET (Q21) is supplied at its source with a first local oscillation signal from the PLL 13 and is connected at its drain to a transformer M41 of the first stage of the first intermediate frequency circuit 14. Further, data concerning the demultiplexing ratio is supplied from the microcomputer 20 to a variable frequency-demultiplier circuit of the PLL 13 (first local oscillation circuit), thereby controlling the frequency of the first local oscillation signal. In this manner, a broadcast-wave signal having a frequency lower than the first local frequency by the first intermediate frequency is converted into the first intermediate frequency signal, which is then extracted from the first intermediate frequency transformer M41.

Although it is not shown in FIG. 7, as has been explained with reference to FIG. 1, the first intermediate frequency signal extracted from the first intermediate frequency transformer M41 is mixed with an oscillation frequency signal of the second local oscillation circuit in the second mixer circuit and is converted into a second intermediate frequency signal (for example, at 450 KHz). A sound signal is then demodulated from the second intermediate frequency signal.

At the same time, a control signal SLH whose level varies according to the receiving frequency is extracted from the microcomputer 20. More specifically, the signal SLH is at the level "1" when the receiving frequency ranges from 3 to 17 MHz and is at the level "0" when the frequency is higher than 17 MHz and lower than or equivalent to 26.1 MHz. This can be expressed by: 3 MHz≦SLH="1"≦17 MHz<SLH="0"≦26.1 MHz. The signal SLH is supplied to the base of the transistor Q61. With this construction, when the receiving frequency is higher than 17 MHz, the control signal SLH becomes "0", whereby the transistor Q61 is off, and the diode D61 is accordingly off.

Figure 8A:
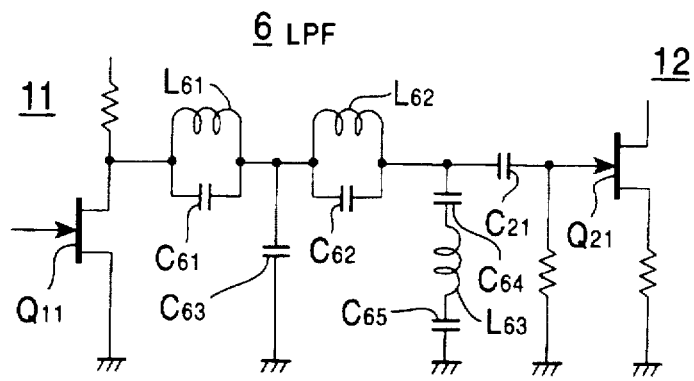
FIGS. 8A to 8C illustrate the present invention.

Consequently, the connecting state of the low-pass filter 6 illustrated in FIG. 7 can be equally depicted as shown in FIG. 8A. The frequency characteristics of the low-pass filter 6 can be indicated by the curve 6A shown in FIG. 8C, that is, the cut-off frequency is, for example, 26.1 MHz. With the above characteristics, the devices C64, L63 and C65 are unnecessary in consideration of the operation inherent in the low-pass filter 6, and such devices also form a resonant circuit. The resonant frequency is, however, sufficiently higher than the cut-off frequency, and thus, there presents no problem even though the devices C64, L63 and C65 are connected to each other. As a consequence, image signals incurred when the receiving frequency is higher can be eliminated by virtue of the above characteristics.

Figure 8B:
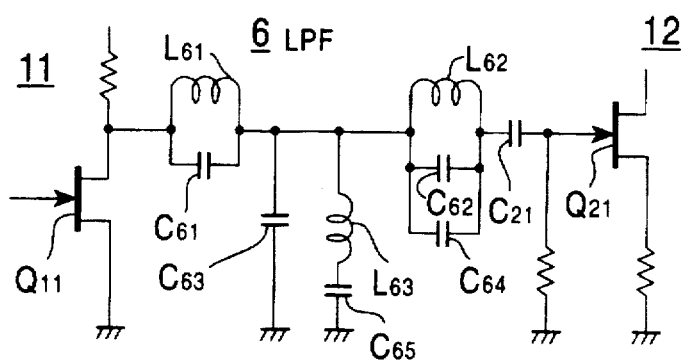
Figure 8C:
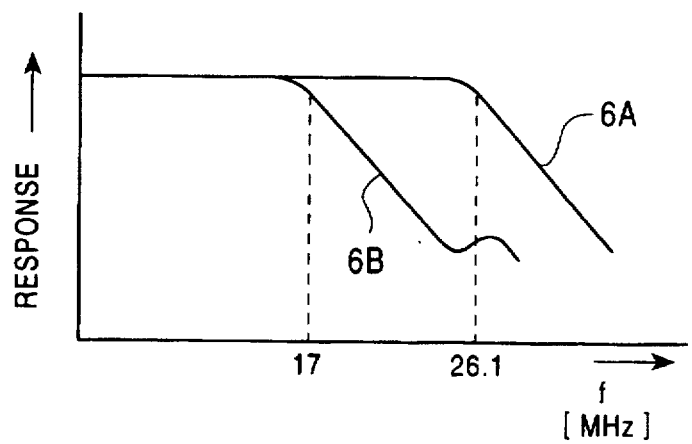

On the other hand, when the receiving frequency is lower than or equivalent to 17 MHz, the control signal SLH becomes "1", whereby the transistor Q61 is on, and the diode D61 is accordingly on. Thus, the connecting state of the low-pass filter 6 shown in FIG. 7 can be equally indicated as illustrated in FIG. 8B. The coil L63 and the capacitor C65 are connected in parallel to the capacitor C63 and, also, the capacitor C64 is connected in parallel to the coil L62 and the capacitor C62. This connecting state lowers the resonant frequency, and the frequency characteristics of the low-pass filter 6 can be indicated by the curve 6B shown in FIG. 8C, that is, the cut-off frequency is, for example, 17.01 MHz. The resonance generated by the coil L61 and the capacitor C61 has no relations with the cut-off frequency. Thus, image signals incurred when the receiving frequency is lower can be eliminated as a result of the above characteristics.

In this manner, in the receiver shown in FIG. 7, as well as the receivers in the previous embodiments, not only when the image frequency is not included within the receiving band, but even when the image frequency is contained within the receiving band, the image signals can be obviated. This only requires a simple construction, i.e., a smaller number of parts, as illustrated in FIG. 7, thereby achieving cost reduction.

Figure 9:
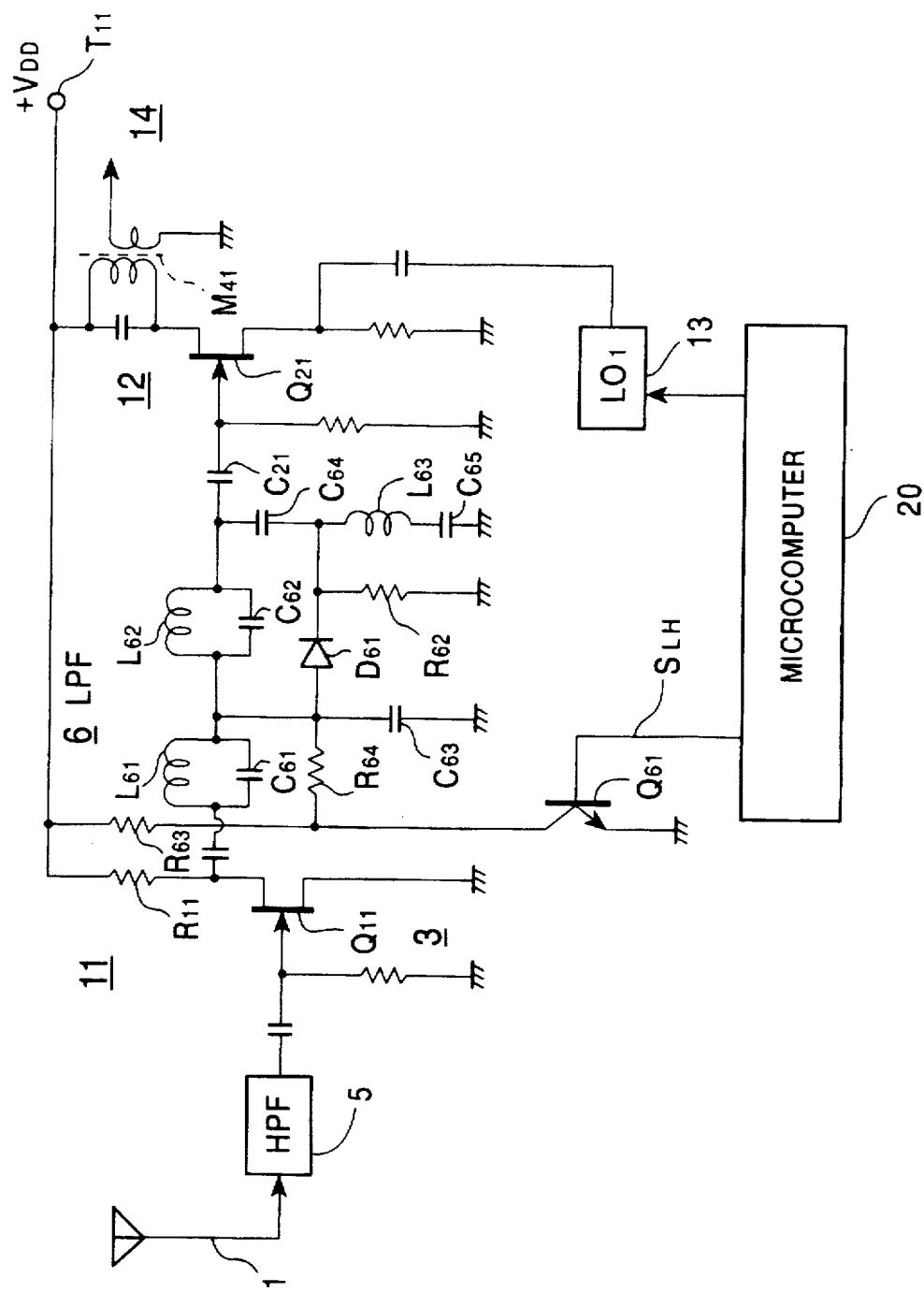
FIG. 9 is a circuit diagram of the essential portions of a seventh embodiment of the present invention.

FIG. 9 illustrates a seventh embodiment and shows the essential elements only. The same elements as those shown in FIG. 7 are designated by like reference numerals, and a detailed explanation thereof will thus be omitted. FIG. 9 illustrates another method for controlling the on/off state of the diode D61. The device determining the cut-off frequency of the low-pass filter 6 in a high-frequency band is connected in a manner similar to the low-pass filter 6 shown in FIG. 7. The cathode of the diode D61 is pulled down via a resistor R62, while the anode is pulled up via resistors R63 and R64, the pull-up state being controlled by the transistor Q61. It should be noted that the relationship between the level of the control signal SLH and the receiving frequency shown in FIG. 9 is reversed to that illustrated in FIG. 7. Thus, image signals can also be eliminated in this low-pass filter 6 shown in FIG. 9, as well as the filter 6 illustrated in FIG. 7.

In the circuit shown in FIGS. 1 and 3, the coils L12 and L13 may be integrated into one coil, such as the coil L15 of FIGS. 4 and 5, and the tap of the integrated coil may be connected to the emitter of the transistor Q13 shown in FIG. 1 or to the diode D13 illustrated in FIG. 3. Also, in the foregoing embodiments employing the frequency synthesizer method, the first local oscillation circuit 13 is formed by a PLL. However, the oscillation circuit 13 may be constructed by a combination of a variable capacitor and a coil, in which case, the switch may be turned on or off in cooperation with the variable capacitor, thereby generating a control signal SLH. Additionally, as has been explained with reference to FIG. 1, a first intermediate frequency signal extracted from the first intermediate frequency transformer M41 is mixed with an oscillation frequency signal of the second local oscillation circuit in the second mixer circuit and is frequency-converted into a second intermediate frequency signal, though not shown. A sound signal is then demodulated from the second intermediate frequency signal.

As will be clearly understood from the foregoing description, the present invention offers the following advantages. The passband of a high-frequency input circuit can be switched in response to the receiving frequency. This can improve image disturbance characteristics even though the first intermediate frequency is lower. Spurious characteristics can also be enhanced. The first intermediate frequency circuit can be formed inexpensively. Further, the first local oscillation frequency can be lowered, thereby improving the C/N ratio of the VCO of a PLL that forms the first local oscillation circuit. Additionally, tracking adjustments are unnecessary.

What is claimed is:

1. A double super-heterodyne receiver comprising:

a high-frequency input circuit being supplied with a broadcast-wave signal from an antenna, said high-frequency input circuit including a high-frequency amplifying device disposed on a signal line for said broadcast-wave signal, a low-pass filter disposed on the signal line for said broadcast-wave signal, a high-pass filter disposed on the signal line for said broadcast-wave signal, a first switching device for changing a cut-off frequency of said low-pass filter, and a second switching device for changing a cut-off frequency of said high-pass filter, wherein said low-pass filter is disposed on the signal line in a stage prior to said high-frequency amplifying device, and said high-pass filter is disposed on the signal line in a stage subsequent to said high-frequency amplifying device, said first and second switching devices of said low-pass filter and said high-pass filter, respectively, being controlled to be on or off in response to a control signal related to the receiving frequency, thereby changing the passband of said bandpass characteristics;

a first local oscillation circuit producing a first local oscillation signal;

a first mixer circuit receiving said first local oscillation signal for frequency converting an output signal of said high-frequency input circuit to a first intermediate frequency signal;

a second mixer circuit receiving a second local oscillation signal for frequency converting said first intermediate frequency signal to a second intermediate frequency signal; and a demodulation circuit for demodulating said second intermediate frequency signal to an original sound signal, wherein said low-pass filter and said high-pass filter provide bandpass characteristics for a receiving band of said broadcast-wave signal, and said switching device is controlled to be on or off in response to a receiving frequency of said broadcast-wave signal, thereby changing a passband of said bandpass characteristics and wherein said first local oscillation circuit includes a phase-locked loop (PLL) having a voltage comparison circuit for comparing a control voltage for an oscillation frequency of said PLL with a reference voltage provided by a potentiometer and that has a voltage corresponding to a predetermined receiving frequency, said first and second switching devices of said low-pass filter and said high-pass filter being controlled by the control signal corresponding to a comparison output from said voltage comparison circuit.

2. A double super-heterodyne receiver according to claim 1, wherein said low-pass filter comprises a coil and a capacitor disposed on the signal line between said antenna and an input terminal of said high-frequency amplifying device, and said high-pass filter comprises a coil and a capacitor connected to an output terminal of said high-frequency amplifying device.

3. A double super-heterodyne receiver according to claim 1, wherein said low-pass filter is disposed on the signal line in a stage subsequent to said high-frequency amplifying device and said high-pass filter is disposed on the signal line in a stage prior to said high-frequency amplifying device.

4. A double super-heterodyne receiver comprising:

a high-frequency input circuit being supplied with a broadcast-wave signal from an antenna, said high-frequency input circuit including a high-frequency amplifying device disposed on a signal line for said broadcast-wave signal, a low-pass filter disposed on the signal line for said broad-cast wave signal, a high-pass filter disposed on the signal line for said broadcast-wave signal, and a switching device for changing a cut-off frequency of said low-pass filter, wherein said low-pass filter is disposed on the signal line in a stage subsequent to said high-frequency amplifying device and said high-pass filter is disposed on the signal line in a stage prior to said high-frequency amplifying device;

a first local oscillation circuit producing a first local oscillation signal;

a first mixer circuit receiving said first local oscillation signal for frequency converting an output signal of said high-frequency input circuit to a first intermediate frequency signal;

a second mixer circuit receiving a second local oscillation signal for frequency converting said first intermediate frequency signal to a second intermediate frequency signal; and a demodulation circuit for demodulating said second intermediate frequency signal to an original sound signal, wherein said low-pass filter and said high-pass filter provide bandpass characteristics for a receiving band of said broadcast-wave signal, and said switching device is controlled to be on or off in response to a receiving frequency of said broadcast-wave signal, thereby changing a passband of said bandpass characteristics, wherein said low-pass filter comprises:

a first parallel circuit formed of a first coil and a first capacitor connected in parallel to each other;

a second parallel circuit formed of a second coil and a second capacitor connected in parallel to each other, said first and second parallel circuits connected in series to said broadcast-wave signal line;

a third capacitor connected between ground and a node of said first and second parallel circuits; and a series circuit formed of a fourth capacitor, a third coil and a fifth capacitor connected in series to each other between ground and an output terminal of said second parallel circuit, wherein said switching device is connected between the node of said first and second parallel circuits and a node of said fourth capacitor and said third coil of said series circuit, said switching device being controlled to be on or off, thereby changing a cut-off frequency of said low-pass filter.

5. A double super-heterodyne receiver according to claim 4, wherein said switching device is controlled to be on or off in response to a receiving frequency of said broadcast wave signal in such a manner that said switching device is turned on when the receiving frequency is lower than a predetermined value, and turned off when the receiving frequency is higher than said predetermined value.

6. A double super-heterodyne receiver comprising:

a high-frequency input circuit being supplied with a broadcast-wave signal from an antenna, said high-frequency input circuit including a high-frequency amplifying device disposed on a signal line for said broadcast-wave signal, a low-pass filter disposed on the signal line for said broadcast-wave signal, a high-pass filter disposed on the signal line for said broadcast-wave signal, and a switching device for changing a cut-off frequency of said low-pass filter;

a first local oscillation circuit producing a first local oscillation signal;

a first mixer circuit receiving said first local oscillation signal for frequency converting an output signal of said high-frequency input circuit to a first intermediate frequency signal;

a second mixer circuit receiving a second local oscillation signal for frequency converting said first intermediate frequency signal to a second intermediate frequency signal; and a demodulation circuit for demodulating said second intermediate frequency signal to an original sound signal, wherein said low-pass filter and said high-pass filter provide bandpass characteristics for a receiving band of said broadcast-wave signal, and said switching device is controlled to be on or off in response to a receiving frequency of said broadcast-wave signal, thereby changing a passband of said bandpass characteristics, wherein said high-pass filter is disposed on the signal line in a stage prior to said high-frequency amplifying device, and said low-pass filter is disposed on the signal line in a stage subsequent to said high-frequency amplifying device, said low-pass filter comprising:

a first parallel circuit formed of a first coil and a first capacitor connected in parallel to each other;

a second parallel circuit formed of a second capacitor connected in parallel to each other, said first and second parallel circuits connected in series to a high-frequency signal line;

a third capacitor connected between ground and a node of said first and second parallel circuits; and a series circuit formed of a fourth capacitor, a third coil and a fifth capacitor connected in series to each other between ground and an output terminal of said second parallel circuit, wherein said switching device is connected between the node of said first and second parallel circuits and a node of said fourth capacitor and said third coil of said series circuit.

7. A double super-heterodyne receiver in according to claim 6, wherein said switching device is controlled to be on or off in response to a receiving frequency of said broadcast-wave signal in such a manner that said switching device is turned on when the receiving frequency is lower than a predetermined value, and turned off when the receiving frequency is higher than said predetermined value.

* * * * *